US008847659B1

(12) United States Patent
Lan et al.

(10) Patent No.: US 8,847,659 B1
(45) Date of Patent: Sep. 30, 2014

(54) SYSTEMS AND METHOD FOR LEVEL SHIFTERS

(71) Applicant: Taiwan Semiconductor Manufacturing Co. Ltd., Hsin-Chu (TW)

(72) Inventors: Po-Hsiang Lan, Taipei (TW); Yu-Ren Chen, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/803,509

(22) Filed: Mar. 14, 2013

(51) Int. Cl.
*H03L 5/00* (2006.01)
(52) U.S. Cl.
USPC .............................. 327/333; 326/80; 326/81
(58) Field of Classification Search
USPC ...................................... 327/333; 326/80, 81
See application file for complete search history.

(56) References Cited

U.S. PATENT DOCUMENTS

| 7,948,810 | B1 * | 5/2011 | Tang et al. | 365/189.11 |
|---|---|---|---|---|
| 8,218,377 | B2 * | 7/2012 | Tandon et al. | 365/189.11 |
| 8,270,234 | B1 | 9/2012 | Tang et al. | |
| 8,339,177 | B2 | 12/2012 | Jarrar et al. | |
| 8,441,301 | B2 * | 5/2013 | Duby et al. | 327/333 |
| 8,456,194 | B2 * | 6/2013 | Lencioni et al. | 326/81 |

* cited by examiner

*Primary Examiner* — Kenneth B. Wells
(74) *Attorney, Agent, or Firm* — Eschweiler & Associates, LLC (57) ABSTRACT

A level shifter system includes an inverting portion, a non-inverting portion and a cross latch output component. The inverting portion is configured to receive an inverting input, a supply voltage and to generate an intermediary inverting output. The non-inverting portion is configured to receive a non-inverting input, the supply voltage and to generate an intermediary non-inverting output. The cross latch output component is configured to drive the intermediary inverting and non-inverting outputs to inverting and non-inverting outputs, respectively. The inverting and non-inverting outputs are at selected upper and lower levels according to the inverting input and non-inverting inputs, respectively.

20 Claims, 6 Drawing Sheets

SYSTEMS AND METHOD FOR LEVEL SHIFTERS

BACKGROUND

Many electronic circuits utilize more than one supply level to improve speed and operation of the circuits, while mitigating power consumption. For example, a circuit may have portions operating at a first level and other portions operating at a second level. Additionally, the circuit may have varied modes that utilize different power levels, such as sleep modes, low power modes, and the like. Some examples of varied voltage levels are 5 V, 3.3 V, 1.8 V and the like.

The varied voltage levels can be provided in a number of ways. For example, separate power sources can be utilized to provide the varied levels. However, this can be costly in terms of die space and complexity. As another example, a level shifter can be used to select or provide varied levels from a single power source. Thus, varied levels of 2.5 V and 5V can be provided using a level shifter with a single 5V power source. However, these approaches can be costly to implement and may suffer reliability issues.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one ordinary skill in the art, that one or more aspects described herein may be practiced with a lesser degree of these specific details. In other instances, known structures and devices are shown in block diagram form to facilitate understanding.

Figure 1:
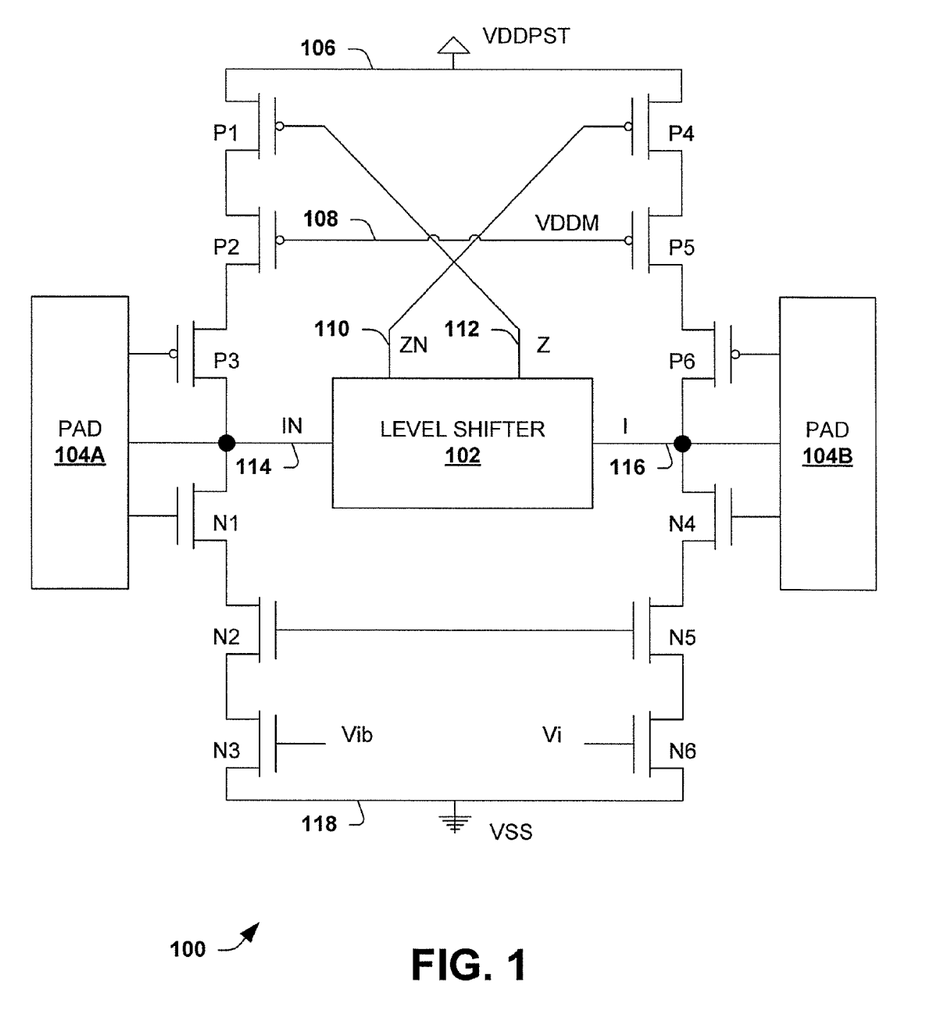
FIG. 1 is a diagram illustrating a system using varied voltage supply levels according to an embodiment of the present disclosure.

FIG. 1 is a diagram illustrating a system 100 using varied voltage supply levels according to an embodiment of the present disclosure. The system 100, in this example, supports over-drive and under-drive modes and/or applications. The system 100 receives an input signal (Vi and Vib) and provides outputs (Z and ZN) at proper levels according to the mode being used and input signals I and IN. The system 100 utilizes a cross coupled level shifter 102 to generate the outputs Z and ZN at upper and lower levels, even for input signals I and IN below a lower limit. The lower limit is a value proximate to ground and is specified further below.

The system 100 includes a level shifter 102, a first pad tracker 104A, a second pad tracker 104B, PMOS transistors P1-P6 and NMOS transistors N1-N6. The PMOS transistors P1, P2, and P3 and the NMOS transistors N1, N2 and N3 are connected serially to form a left side of the system 100. The PMOS transistors P4, P5, and P6 and the NMOS transistors N4, N5, and N6 are connected serially to form a right side of the system 100.

The first pad 104A is coupled to gates of the transistors P3 and N1 and provides an inverted input signal (IN) 114 to the level shifter 102. The first pad 104A also controls gate voltages of the transistors P3 and N1, in order to control or reduce a drain to source peak of the transistor N1. The second pad 104B is coupled to gates of the transistors P6 and N4 and provides an input signal (I) 116 to the level shifter 102. The second pad 104B also controls gate voltages of the transistors P6 and N4, in order to control or reduce a drain to source peak of the transistor N4.

The system 100 has a middle power supply (VDDM) 108 present at the gates of the transistors P2 and P5. The middle power supply 108, also referred to as the middle power, operates at 1.8 V for the under-drive mode and at 3.3 V for the over-drive mode. Other values of the middle power supply 108 are within the contemplated scope of the disclosure. The system 100 also has an input/output (I/O) power supply (VDDPST) 106 at sources of the transistors P1 and P4. The sources of the transistors N3 and N6 are coupled to VSS 118. Gates of the transistors N3 and N6 receive inputs (Vib and Vi). The I/O power supply 106 is set at 3.3 V for the over-drive mode and at 1.8 V for the under-drive mode. The inputs Vib and Vi vary between about 0 and 1.8 V for both under-drive and over-drive modes. Corresponding leveled values appear at the outputs 110 and 112 and toggle between 0 and 1.8 V for the under-drive mode and between 0 and 3.3 V for the over-drive mode.

The middle power supply 108 is responsible for conduction of the transistors P2 and P5. When the middle power supply 108 switches to 0, the transistors P5 and P2 conduct normally (are ON). When the middle power supply 108 switches to 1.8V, the transistors P2 and P5 do not conduct (OFF).

The inputs Vi and Vib are leveled up to desired output voltage levels at the outputs 110 and 112. The I/O power supply 106 is set at 3.3 V for the over-drive mode and at 1.8 V for the under-drive mode. Other values of the power supply 106 are within the contemplated scope of the disclosure.

The transistors P1-P6 and N1-N6 are 1.8 V devices and are utilized for voltage conversion. A gate of the transistor P1 receives an output (Z) 112 from the level shifter 102. A gate of the transistor P4 receives an inverted output (ZN) 110 from the level shifter 102.

The transistors N1 and P3 form a pad tracking stage wherein their gate terminals are connected to the pad tracker 104A and the stage is configured to reduce a peak drain to source voltage of the transistor N1. The transistors N4 and P6 operate similarly with respect to the pad tracker 104B. The transistors N2 and P2 form a mid-bias stage, which is configured to sustain the input signal IN during over-voltage stress. The transistors P5 and N5 similarly form a mid-bias stage configured to sustain the input signal I during over-voltage stress. The transistors P1 and N3 form a driving stage, which is controlled by the inverting signals Vib (for N3) and by the non-inverting output (Z). Similarly, the transistors P4 and N6 form a driving stage, which is controlled by the signal Vb (for N6) and by the inverting output (ZN). When Vi is at a logic value of 1, the input signal I 116 is discharged to 0 and the transistor P1 is switched on by the non-inverting output signal Z. Then, the input signal IN is driven to a logic value of 1 thereafter. Similarly, when Vib is at a logic value of 1, the inverted input signal IN 114 is discharged to 0 and the transistor P4 is switched on by the inverting output signal ZN. Then, the non-inverting input signal "I" 116 is driven to a logic value of 1.

The level shifter 102 is a cross coupled shifter that provides the outputs 110 and 112 with relatively improved reliability compared to another approach. The level shifter 102 includes a cross coupled output component and supports an over-drive mode at 3.3V and under-drive mode at 1.8V at the outputs 110 and 112. In the over-drive mode, the outputs (Z and ZN) 110 and 112 toggle between 1.8V and 3.3V. In the under-drive mode, the outputs 110 and 112 toggle between 0V and 1.8V. For the over-drive mode, the I/O power supply (VDDPST) 106 is at 3.3V. For the under-drive mode, the I/O power supply 106 is at 1.8V.

Other level shifters without a cross coupled output component can have a dead-zone effect wherein the shifter outputs fail to reach a ground voltage levels in the under-drive mode. This is referred to as a dead-zone effect and is described in additional detail below. Reliability issues can be encountered as a result.

The level shifter 102 includes the cross coupled output component that facilitates driving the outputs (Z and ZN) 110 and 112 to ground voltage for the under-drive mode. In one example, the cross coupled output component (not shown) includes two NMOSFET transistors configured to drive the outputs 110 and 112 to ground for the under-drive mode. As a result, the level shifter 102 provides suitable output levels for both the over-drive and under-drive modes.

It is appreciated that the level shifter 102 is explained with over-drive modes and under-drive modes, but other output levels and modes are contemplated.

Figure 2:
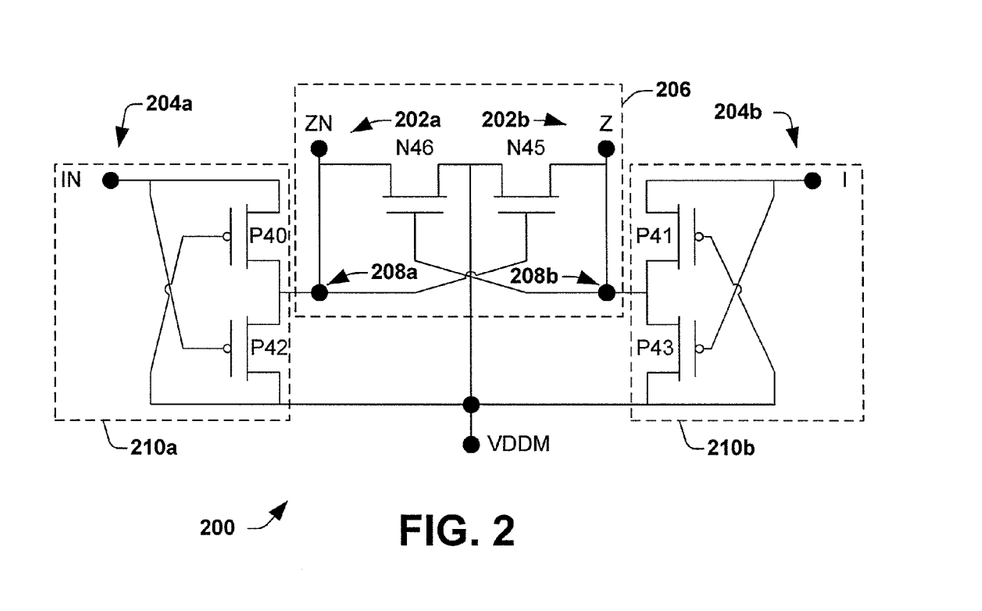
FIG. 2 is a diagram of a level shifter having a cross latch output component according to an embodiment of the present disclosure.

FIG. 2 is a diagram of a level shifter 200 having a cross latch output component according to an embodiment of the present disclosure. The level shifter 200 is configured to receive an input signal having an input voltage and provide an output signal having an output voltage at a selected or desired level. Further, the level shifter 200 is configured to provide the selected level for a complete range of the input voltage, including values proximate to ground or 0V, also referred to as the lower limit.

The selected level of the output signal (Z or ZN) depends on a mode of operation. The level shifter 200 is configured to mitigate dead zone issue. The dead zone issue is an effect present in other approaches wherein a level shifter is unable to provide output signals at values below the lower limit. The lower limit is typically a function of PMOS transistors coupled to shifter outputs.

The level shifter 200 mitigates and/or avoids the dead zone effect. As a result, the level shifter 200 produces suitable output signal levels, including levels in both over-drive and under-drive modes. Additionally, the levels shifter 200 is an example of a suitable level shifter that can be utilized for the level shifter 102 of system 100, described above.

The shifter 200 includes an inverting portion 210a, a non-inverting portion 210b, and a cross latch component 206. The inverting portion 210a is formed by PMOS transistors P40 and P42. The non-inverting portion 210b is formed by PMOS transistors P41 and P43.

The non-inverting portion 210b is configured to receive a non-inverting input "I" at input node 204b and a middle power supply VDDM and to provide an intermediary non-inverting output at node 208b. A source of the transistor P41 and a gate of the transistor P43 are connected to the non-inverting input node 204b, which receives a non-inverting input I. A source of the transistor P43 and a gate of the transistor P41 are connected to the middle supply voltage VDDM. A drain of the transistor P43 and a drain of the transistor P41 are connected to the node 208b, which provides an intermediate non-inverting output. It is appreciated that the identified sources and drains are for reference purposes and they can vary during use according to modes of operation and/or applied voltages.

The non-inverting input I toggles between upper and lower values. The cross latch component 206 is configured to further modify the intermediary non-inverting output and provide a non-inverting output Z at node 202b. The non-inverting output Z is a level shifted output voltage at a voltage value corresponding to a voltage value of the non-inverting input I.

The middle power supply VDDM has a value corresponding to a lower or bottom level of the non-inverting output Z. An upper level of the non-inverting output Z corresponds to an upper value of the input I. Thus, the upper and lower output levels of the output Z can be adjusted for various modes of operation by adjusting the input I and the middle power supply VDDM.

Similarly, the-inverting portion 210a is configured to receive an inverting input "IN" at input node 204a and a middle power supply VDDM and to provide an intermediary inverting output at node 208a. A source of the transistor P40 and a gate of the transistor P42 are connected to input node 204a, which receives the inverting input IN. A gate of the transistor P40 and a source of the transistor P42 are connected to the middle supply (VDDM). A drain of the transistor P40 and a drain of the transistor P42 are connected to the node 208a. The intermediate inverting output node 208a provides an intermediate inverting output. A source of the transistor P40 and a gate of the transistor P42 are coupled to the inverting input node 204a that receives the inverting input IN.

The inverting input IN toggles between upper and lower values. The cross latch component 206 is configured to further modify the intermediary inverting output and provide an inverting output ZN at node 202a. The inverting output ZN is a level shifted output voltage at a voltage value corresponding to a voltage value of the non-inverting input I.

The cross latch component 206 includes a pair of cross latch NMOS transistors N46 and N45. Gates of the cross latch transistors N46 and N45 are cross connected to the intermediate output 208b, 208a, respectively. A drain of the transistor N46 and the gate of the transistor N45 are connected to the node 208a and a drain of the transistor N45 and the gate of the transistor N46 are connected to the node 208b. A source of the transistor N46 and a source of the transistor N45 are connected to the middle supply voltage VDDM. It is noted that nodes 202a and 208a are effectively the same node. Similarly, nodes 202b and 208b are also effectively the same node.

The middle power supply VDDM has a value corresponding to a lower or bottom level of the inverting output ZN. An upper level of the inverting output ZN corresponds to an upper value of the inverting input IN. Thus, the upper and lower output levels of the inverting output ZN can be adjusted for various modes of operation by adjusting the inverting input IN and the middle power supply VDDM.

In one example, the shifter 200 is configured to operate in an over-drive mode. In this mode, the input signals I and IN vary or toggle between the upper and lower values of 3.3V and 0V, respectively. The middle power supply VDDM is set at a voltage of about 1.8V. The output signals Z and ZN track the input signals I and IN, but toggle between upper and lower limits of 3.3V and 1.8V, respectively. Effectively, in the over-drive mode, the lower value of the output signal Z is shifted from the lower value of the input signal I of 0V to 1.8V. Similarly, the lower value of the output signal ZN is shifted from the lower value of the input signal IN of 0V to 1.8V.

With VDDM at 1.8V, the shifter 200 operates in the over-drive mode. With I at 0V, the gate of the transistor P43 is at 0V, causing the transistor P43 to turn ON. The gate of the transistor P41 is at 1.8V, which turns the transistor P41 OFF. As a result, the source of the transistor P43 is at 1.8V and is provided to its drain and the intermediary node 208b. The 1.8V is propagated to the output node 202b and is provided as the output signal Z. Operation of the inverting portion 210a mirrors the operation of the non-inverting portion 210b.

In contrast, with I at 3.3V the gate of the transistor P43 is at 3.3V, causing the transistor P43 to turn OFF. The source of the transistor P41 is at 3.3V and the gate of the transistor P41 is at 1.8V, which turns the transistor P41 ON. The 3.3V at the source of the transistor P41 is provided at its drain and, as a result, at the intermediary node 208b. The 3.3V is also propagated to the output node 202b and is provided as the output signal Z. Operation of the inverting portion 210a mirrors the operation of the non-inverting portion 210b.

In another example, the shifter 200 is configured to operate in an under-drive mode. In this mode, the input signals I and IN vary or toggle between the upper and lower values of 1.8V and 0V, respectively. The middle power supply VDDM is set at a voltage of about 0V. The output signals Z and ZN track the input signals I and IN, but toggle between upper and lower limits of 1.8V and 0V, respectively.

With VDDM at 0V, the shifter 200 operates in the under-drive mode. VDDM at 0V is also at the source of the transistor P43. When the input signal I is at 1.8V, the gate of the transistor P43 is 1.8V. As a result, the transistor P43 is turned OFF. VDDM at 0V is also that gate of the transistor P41. Input I at 1.8V is also at the source of the transistor P41. As a result, the transistor P41 is turned ON, and propagates the input signal I at 1.8V to the intermediary node 208b and the output node 202b. As a result, the output signal Z is at 1.8V. Operation of the inverting portion 210a mirrors the operation of the non-inverting portion 210b.

In contrast, when the signal input I is at 0V, the gate of the transistor P43 is 0V. The transistor P43 is turned on by the input signal I being at 0V at its gate. The source of the transistor P43 propagates the 0V to its drain. The transistor P41 is turned ON by the VDDM being at 0V at its gate. The source of the transistor P41 propagates the 0V to its drain. The transistors P41 and P43 are both on and behave as high-voltage convoys and the threshold voltage of the transistors P41/P43 would prevents the node 208b from being driven to 0V without the cross latch output component 206. The threshold voltage yields a lower limit. The behavior of the P41 and P43 transistors is referred to as a dead zone dilemma or dead zone problem. Operation of the inverting portion 210a mirrors the operation of the non-inverting portion 210b.

The transistor N45 of the cross latch component 206 pulls the output signal Z and the nodes 208b and 202b to 0V as follows. By operation of the level shifter 200, with the input signal I at 0V, the inverting input signal IN is at 1.8V. The inverting input signal IN is at the gate of the transistor P42, and is 1.8V. The VDDM is at 0V and is at the source of the transistor P42. As a result, the transistor P42 is turned OFF. The inverting input signal IN is also at the source of the transistor P40, and is 1.8V. The VDDM at 0V is also at the gate of the transistor P40. As a result, the transistor P40 is turned ON. The source of the transistor P40 is at 1.8V. Consequently, the drain of the transistor P40, which is connected to node 208a, is at 1.8V. The node 208a is also at the gate of the transistor N45, thus the gate of the transistor N45 is at 1.8V. The node VDDM at 0V is also at the drain of the transistor N45. As a result, the transistor N45 is turned ON and the output node 202b is pulled to the VDDM, which is 0V. In other words, the output signal Z is pulled to 0V by the cross latch component 206. The transistor N45 does not have the threshold voltage issue that the transistor P41 has. Operation of the inverting portion 210a mirrors the operation of the non-inverting portion 210b.

As can be seen, embodiments of the disclosure are advantageous over other approaches that do not have the cross latch component 206, because without the cross latch component 206, the output node 208b would not reach the selected lower level.

To summarize, when the input signal I transitions from an upper level (e.g., 1.8V) to a lower level of 0V, the level shifter 200 encounters a dead zone. This dead zone occurs when the input signal I reaches and is lower than a threshold voltage of the transistor P41. The threshold voltage is also referred to as a lower limit. In the dead zone, the transistor N45 pulls node 208b to 0V as explained above.

As an example, when the input signal I is 1.8 V, transistor P43 is turned OFF, and the transistor P41 is turned ON as explained above. Because the transistor P41 is turned ON, the voltage level of the output node Z or node 208b at the drain of the transistor P41 follows voltage level of the input signal I at the source of the transistor P41. Explained in a different way, a dead zone exists when the voltage level of the input signal is lower than the threshold voltage of the transistor P41. The transistor N45 pulls the node 202b to 0V and resolves the dead zone problem. Operation of the inverting portion 210a mirrors the operation of the non-inverting portion 210b.

The dead zone problem is described with regard to the under-drive mode, however it is appreciated that the dead zone problem is avoided by the cross latch component 206 in other modes and at other applied voltages. Further, it is appreciated that other modes are contemplated.

In brief, for the over-drive mode example described above, the outputs 202a, 202b provide levels that toggle between 1.8V and 3.3V with the VDDM at 1.8V and the input signals IN and I toggle between 0 and 3.3V. When the VDDM switches to 1.8V from 0V, the level shifter 200 changes to the under-drive mode, the outputs 202a, 202b provide levels that toggle between 0 and 1.8V.

The lower limit or threshold value varies according to the type of transistors and/or processes used in fabrication for P41 and P40. Typically, the threshold value (Vth) ranges from about 300 mV to about 500 mV. Once the gate-source voltage is below the threshold voltage, the transistor P41 or P40 loses its driving force.

Figure 3:
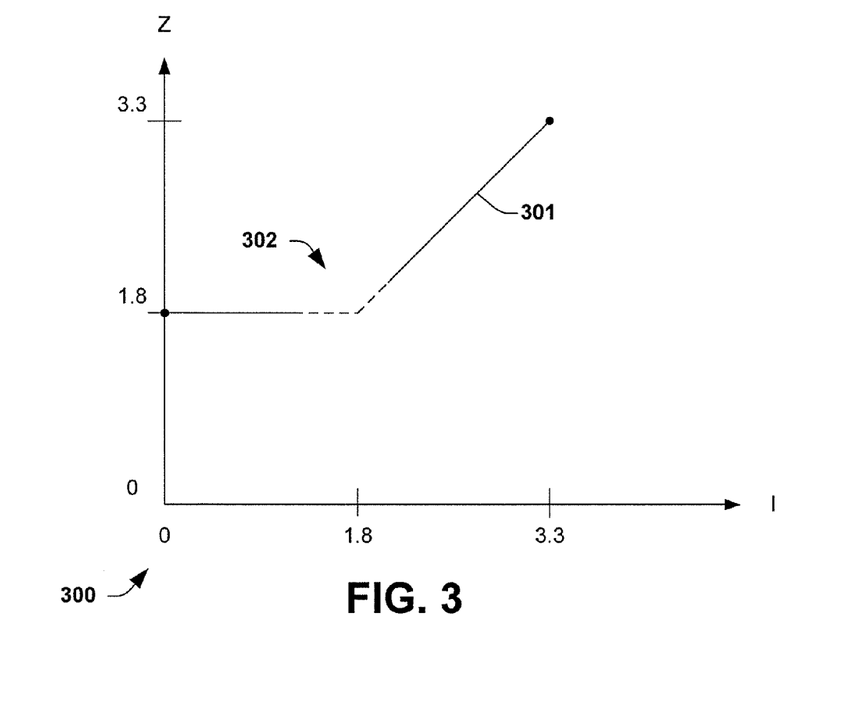
FIG. 3 is a graph illustrating non-inverting inputs and outputs for the level shifter having a cross latch output component of FIG. 2 during an over-drive mode according to an embodiment of the present disclosure.

FIG. 3 is a graph 300 illustrating non-inverting inputs and outputs for the level shifter 200 having a cross latch output component of FIG. 2 during an over-drive mode. The middle supply voltage (VDDM) is at about 1.8V for the over-drive mode.

Line 301 depicts a non-inverting output Z compared with a non-inverting input I. An x-axis depicts the non-inverting input I increasing from zero and a y-axis depicts the non-inverting output Z increasing from zero. As the input I changes from zero to 1.8V, the output Z stays at about 1.8V. As the input I increases from 1.8 to 3.3V, the output Z changes with the input from 1.8 to 3.3V.

The graph 300 includes a transition portion 302, as illustrated by a dashed line, where the output Z changes from a constant value to an increasing value in response to the input I. The inverting output ZN and the inverting input IN operate in a similar manner.

Figure 4A:
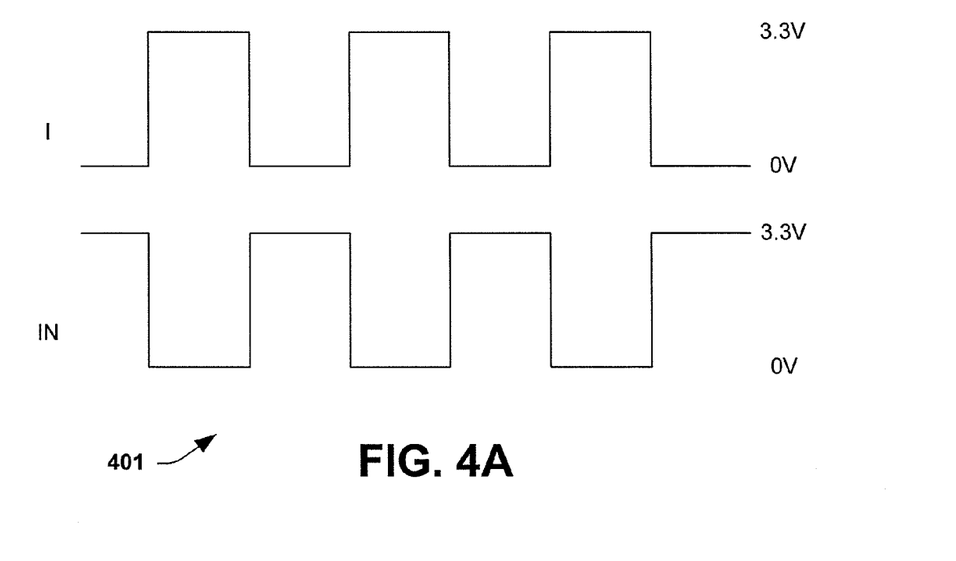
FIG. 4A is a timing diagram that depicts inverting and non-inverting inputs for the level shifter having a cross latch output component of FIG. 2 during an over-drive mode according to an embodiment of the present disclosure.
Figure 4B:
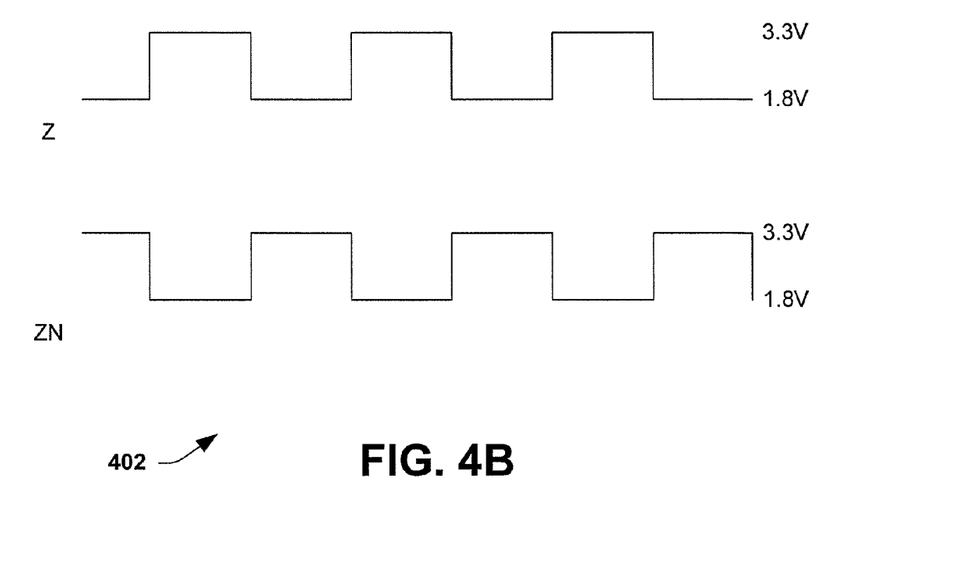
FIG. 4B is another timing diagram that depicts inverting and non-inverting outputs for the level shifter having a cross latch output component of FIG. 2 during according to over-drive mode in an embodiment of the present disclosure.

FIGS. 4A and 4B are timing diagrams and show inputs and outputs for the over-drive mode for the level shifter 200 of FIG. 2.

FIG. 4A is a timing diagram 401 that depicts inverting and non-inverting inputs for the over-drive mode according to an embodiment of the present disclosure. The non-inverting input is designated as I and the inverting input is designated as IN. The inverting input IN toggles between 0 and 3.3V as shown. The non-inverting input I also toggles between 0 and 3.3V, but is inverted compared with the inverting input.

FIG. 4B is a timing diagram 402 that depicts inverting and non-inverting outputs for the over-drive mode according to an embodiment of the present disclosure. A non-inverting output is designated as Z and an inverting output is designated as ZN.

For the over-drive mode, a non-inverting input value at 3.3V corresponds to a non-inverting output value of 3.3V and a non-inverting input value at 0V corresponds to a non-inverting output value of 1.8V. Thus, the outputs follow along with the inputs and toggle between 1.8V and 3.3V.

Figure 5:
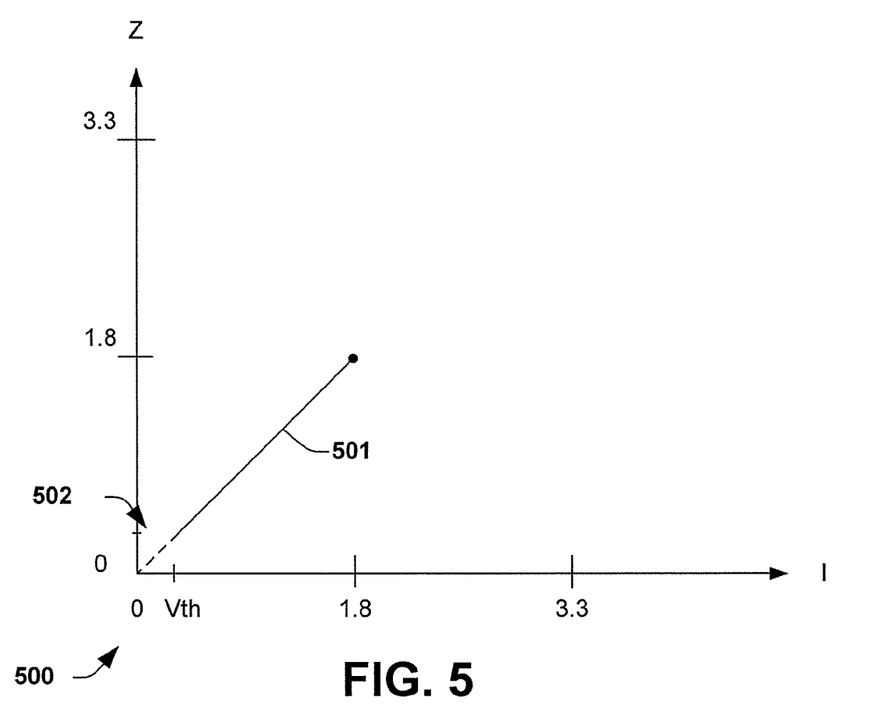
FIG. 5 is a graph illustrating non-inverting inputs and outputs for the level shifter having a cross latch output component of FIG. 2 for an under-drive mode according to an embodiment of the present disclosure.

FIG. 5 is a graph 500 illustrating non-inverting inputs and outputs for the level shifter 200 of FIG. 2 for an under-drive mode according to an embodiment of the present disclosure. The middle supply voltage (VDDM) is at about 0V for the under-drive mode.

Line 501 depicts a non-inverting output Z compared with a non-inverting input I. An x-axis depicts the non-inverting input I increasing from zero V and a y-axis depicts the non-inverting output Z increasing from zero V. As the input I changes from zero to 1.8V, the output Z changes with the input from zero to 1.8V.

The graph 500 includes a near ground transition portion 502 where the input signal I is less than a lower limit or threshold value, designated as Vth in the drawing and shown as a dashed line. The lower limit or the threshold value Vth results from the transistor P41 and/or the transistor P43 of the non-inverting portion 210b, as described above in the dead zone problem. The lower limit is proximate 0V, and may be, for example, within a range of about 300 mV to about 500 mV. The use of the cross latch output component 206, in particular the transistor N45, facilitates driving the output Z to values below the lower limit, including output values of zero. Thus, the level shifter 200 drives the output to a selected lower level when the input is lower than the lower limit. The inverting output ZN and the inverting input IN operate in a substantially similar manner.

Figure 6A:
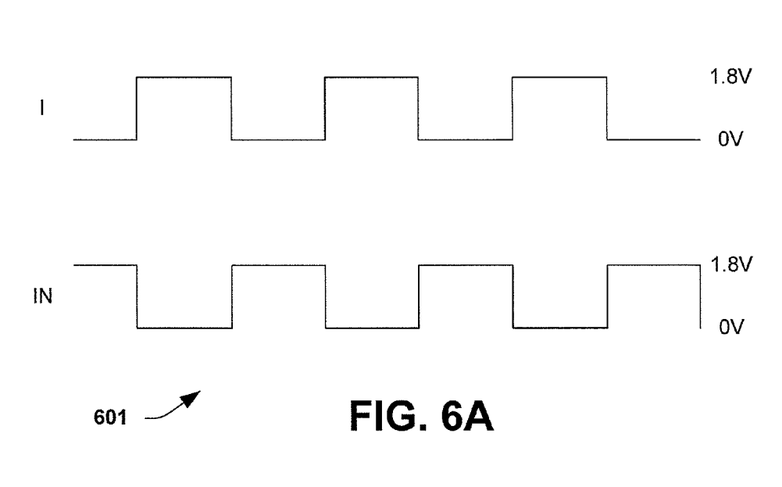
FIG. 6A is a timing diagram that depicts inverting and non-inverting inputs for the level shifter having a cross latch output component of FIG. 2 for an under-drive mode according to an embodiment of the present disclosure.
Figure 6B:
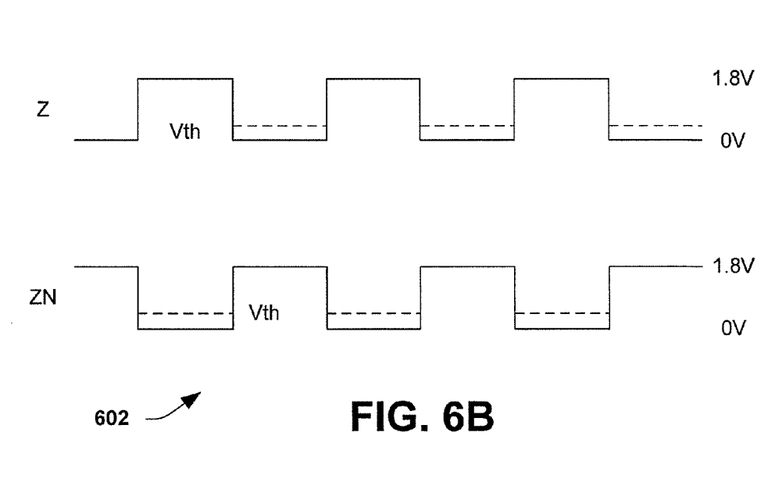
FIG. 6B is another timing diagram that depicts inverting and non-inverting outputs for the level shifter having a cross latch output component of FIG. 2 for an under-drive mode according to an embodiment of the present disclosure.

FIGS. 6A and 6B are timing diagrams and show inputs and outputs for the under-drive mode for the level shifter 200 of FIG. 2.

FIG. 6A is a timing diagram 601 that depicts inverting and non-inverting inputs for the under-drive mode according to an embodiment of the present disclosure. A non-inverting input is designated as I and an inverting input is designated as IN. The inverting input IN toggles between 0 and 1.8V as shown. The non-inverting input I also toggles between 0 and 1.8V, but is inverted compared with the inverting input IN.

FIG. 6B is timing diagram 602 that depicts inverting and non-inverting outputs for the under-drive mode according to an embodiment of the present disclosure. A non-inverting output is designated as Z and an inverting output is designated as ZN.

For the under-drive mode, a non-inverting input value at 1.8V generally corresponds to a non-inverting output value of 1.8V and a non-inverting input value at 0V should correspond to a non-inverting output value of about 0V. Thus, the outputs follow along with the inputs and toggle between 1.8V and 0V.

The outputs Z and ZN reach ground values or 0 due to the presence of the cross latch output component 206 in the level shifter 200. The diagram designates a lower limit or threshold, designated as Vth in FIG. 6B. The output signals Z and ZN would be at the lower limit Vth at input signals I and IN having values of 0V, but for the inclusion of the cross latch output component 206, including the transistors N45 and N46.

Figure 7:
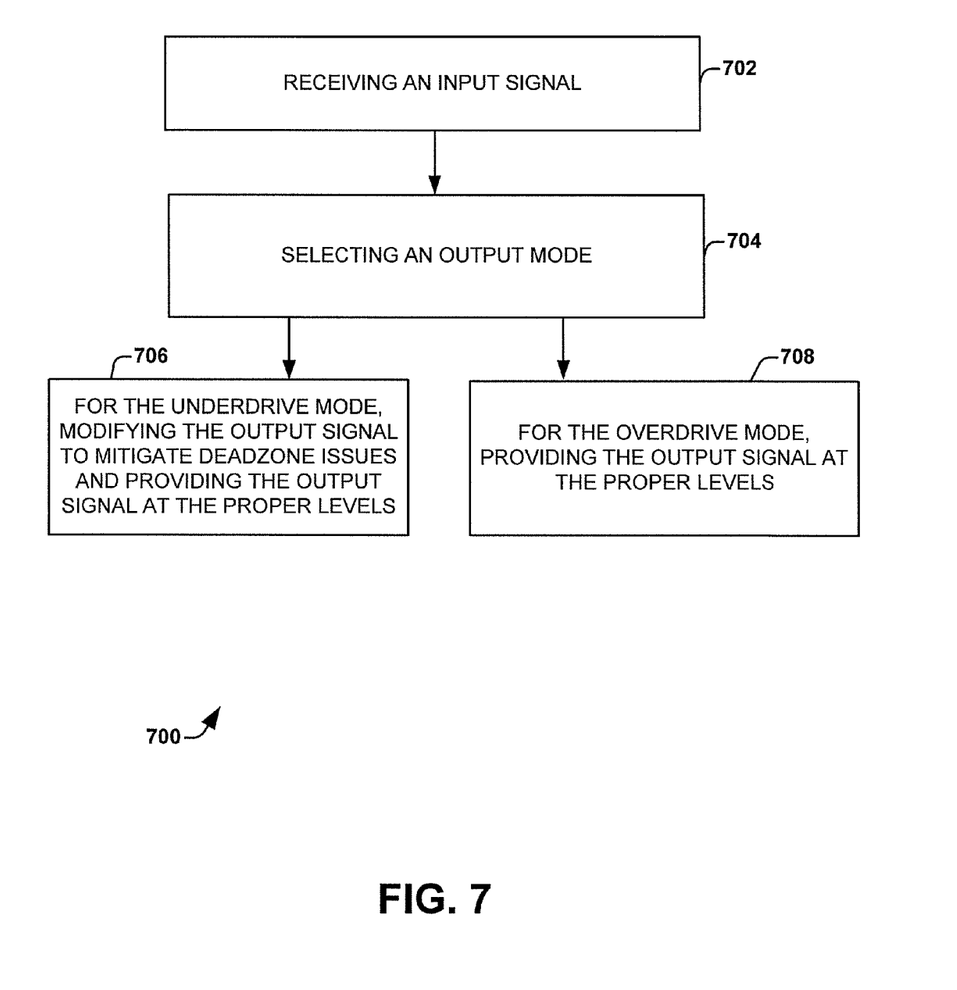
FIG. 7 is a flow diagram illustrating a method of generating an output signal having proper levels according to an embodiment of the present disclosure.

FIG. 7 is a flow diagram illustrating a method 700 of generating an output signal at upper and lower levels according to an embodiment of the present disclosure. The method 700 generates proper output values for multiple modes and mitigates or avoids dead zone issues, even for output values below a lower limit, as described above.

At block 702, an input signal is received. The signal can be inverting or non-inverting, such as the input signals I and IN, shown above. The input signal has a selected frequency and toggles or oscillates at the selected frequency. In one example, the selected frequency is up to 333 MHz.

An output mode is selected at block 704. The output mode is selected from a plurality of modes, such as an over-drive mode, an under-drive mode, and the like. The selected mode indicates shifting for upper and lower levels of the output signal. The output mode can be indicated or selected by configuring the input signal and the middle supply VDDM. In one example, the input signal has values alternating between 1.8V and 0V for an under-drive mode and alternating between 3.3V and 0V for an over-drive mode. A middle power supply is at 0V for the under-drive mode and 1.8V for the over-drive mode.

For the under-drive mode, the output signal is driven down to mitigate or avoid dead-zone issues at block 706. This occurs on the input signal being at or below a value that corresponds to an output value below the lower limit, such as below about 300 to 500 mV. Without being driven down, the output signal would remain at the lower limit. A component, such as the cross latch output component 206 described above, can be utilized to modify the output signal for the under-drive mode. Thus, the output signal is provided having the selected upper and lower levels for the under-drive mode. In one example, the output signal for the under-drive mode oscillates between 0 and 1.8V, which are the proper levels, at the selected frequency and in response to the input signal.

The output signal is provided at the selected upper and lower levels for other modes at block 708. The other modes include the over-drive mode. In one example, the output signal for the over-drive mode oscillates between 1.8V and 3.3V, which are the proper levels for this mode, at the selected frequency in response to the input signal.

It will be appreciated that while reference is made throughout this document to exemplary structures in discussing aspects of methodologies described herein (e.g., the structure presented in above figures, while discussing the methodology set forth in FIG. 7), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those of ordinary skill in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A level shifter system includes an inverting portion, a non-inverting portion and a cross latch output component. The inverting portion is configured to receive an inverting input, a supply voltage and to generate an intermediary inverting output. The non-inverting portion is configured to receive a non-inverting input, the supply voltage and to generate an intermediary non-inverting output. The cross latch output component is configured to drive the intermediary inverting and non-inverting outputs to inverting and non-inverting outputs, respectively. The inverting and non-inverting outputs are at selected upper and lower levels according to the inverting input and non-inverting inputs, respectively.

Another lever shifter system is disclosed and includes an input node, an intermediary node, an output node, a first circuit, and a cross latch output component. The input node is configured to receive an input signal. The intermediary output node is configured to provide an intermediary output. The output node is configured to provide an output signal. The first circuit is coupled to the input node and the intermediary output node. The first circuit is configured to generate the intermediary output in response to the input signal. The cross latch output component is coupled to the intermediary output node and the output node. The cross latch component is configured to drive the intermediary output to the output signal.

A method of operating a level shifter is disclosed. An input signal is received. A level shifter mode is selected from an over-drive mode and an under-drive mode. The output signal is modified to provide output values below a threshold value. The output signal is generated.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A level shifter system comprising:
   an inverting portion including first and second transistors and being configured to receive an inverting input on both a source of the first transistor and a gate of the second transistor and configured to receive a power supply and further configured to generate an intermediary inverting output based on the inverting input and the power supply;
   a non-inverting portion configured to receive a non-inverting input and the power supply and to generate an intermediary non-inverting output; and
   a cross latch output component configured to drive the intermediary inverting and non-inverting outputs to inverting and non-inverting outputs, respectively, the inverting and non-inverting outputs being at selected upper and lower levels according to the inverting input and non-inverting input, respectively.

2. The system of claim 1, wherein the inverting portion includes a PMOS transistor connected between the inverting input and the non-inverting output, wherein the PMOS transistor has a threshold value.

3. The system of claim 2, wherein the cross latch output component is configured to mitigate a dead-zone effect from the PMOS transistor.

4. The system of claim 1, further comprising:
   circuitry configured to provide the non-inverting input to toggle between a first voltage and a second voltage which each differ from a non-zero voltage of the power supply in a first mode;
   wherein the first voltage has a magnitude that is larger than a magnitude of the non-zero voltage level and wherein the second voltage has a magnitude that is smaller than the magnitude of the non-zero voltage level.

5. The system of claim 4, wherein the circuitry is configured to toggle the non-inverting output between a third voltage and the second voltage in the first mode, wherein the third voltage is less than the second voltage.

6. The system of claim 5, wherein the circuitry is configured to toggle the non-inverting input between the first voltage and the third voltage in a second mode.

7. The system of claim 6, wherein the circuitry is configured to toggle the non-inverting output between the first voltage and the third voltage in the second mode.

8. The system of claim 1, wherein the cross latch component includes a pair of cross latched NMOS transistors.

9. The system of claim 1, wherein the cross latch output component includes a first NMOS transistor and a second NMOS transistor, wherein a gate of the second NMOS transistor is connected to the intermediary inverting output, a drain of the second NMOS transistor is connected to the non-inverting output, and a source of the second NMOS transistor is connected to a source of the first NMOS transistor, and wherein a gate of the first NMOS transistor is connected to the intermediary non-inverting output and a drain of the first NMOS transistor is connected to the inverting output.

10. The system of claim 1, wherein the cross latch output component is configured to output values of the inverting and non-inverting outputs to be below a lower limit of the inverting and non-inverting portions in response to at least some input values of the inverting and non-inverting inputs.

11. The system of claim 1, wherein the non-inverting input has a value corresponding to a value of the non-inverting output below a threshold limit, wherein the threshold limit is a function of the non-inverting portion.

12. A level shifter system comprising:
   an input node configured to receive an input signal;
   an intermediary output node configured to provide an intermediary output;
   an output node configured to provide an output signal;
   a first circuit, which includes first and second transistors, coupled to the input node and the intermediary output node, wherein the input node is directly coupled to a source of the first transistor and directly coupled to a gate of the second transistor and wherein the first circuit is configured to generate the intermediary output in response to the input signal; and a cross latch output component coupled to the intermediary output node and the output node, wherein the cross latch component is configured to drive the intermediary output to the output signal.

13. The system of claim 12, wherein the cross latch output component modifies the output signal during a near ground transition portion of an under-drive mode.

14. The system of claim 12, wherein the cross latch output component passes the intermediary output as the output signal during an over-drive mode.

15. The system of claim 12, further comprising:
circuitry configured to provide the input signal at a first range of voltages for a first mode and at a second range of voltages for a second mode, wherein the first range of voltages is different than the second range of voltages.

16. The system of claim 15, wherein the circuitry is configured to provide the first range of voltages to be between a first voltage and a second voltage and the second range of voltages to be between the first voltage and a third voltage, wherein the second voltage is less than the third voltage.

17. The system of claim 15, wherein the first circuit is configured to generate the intermediary output to a lower limit in response to a value of the input signal at a first value and the cross latch component is configured to drive the output signal to a lower level, wherein the first value is less than the lower limit and the lower level is below the lower limit.

18. The system of claim 17, wherein the lower limit is dependent upon a PMOS transistor of the first circuit.

19. A method of operating a level shifter, the method comprising:
selecting one of a first mode and a second mode;
receiving an input signal on an input node, wherein the input signal varies between a first voltage and a second voltage for the first mode and varies between the first voltage and a third voltage for the second mode, wherein the first voltage is less than the second voltage, and wherein the second voltage is less than the third voltage; and
generating an output signal having output values below a threshold value on a latch output node; wherein the output signal varies between the first voltage and the second voltage for the first mode and varies between the second voltage and the third voltage for the second mode.

20. The method of claim 19, wherein modifying the output signal is performed using a cross latch output component.

* * * * *